United States Patent
Huang et al.

(10) Patent No.: US 10,152,098 B2
(45) Date of Patent: Dec. 11, 2018

(54) DYNAMIC HEAT CONDUCTING PATH FOR PORTABLE ELECTRONIC DEVICE

(71) Applicants: Kung Shiuh Huang, Orange, CA (US); Kuan-Tsae Huang, Rockville, MD (US); June Wu, North Potomac, MD (US)

(72) Inventors: Kung Shiuh Huang, Orange, CA (US); Kuan-Tsae Huang, Rockville, MD (US); June Wu, North Potomac, MD (US)

(73) Assignee: AZTRONG INC., Rockville, MD (US)

( * ) Notice: Subject to any disclaimer, the term of this patent is extended or adjusted under 35 U.S.C. 154(b) by 461 days.

(21) Appl. No.: 14/509,913

(22) Filed: Oct. 8, 2014

(65) Prior Publication Data
US 2018/0203492 A1 Jul. 19, 2018

(51) Int. Cl.
G06F 1/20 (2006.01)
G06F 1/16 (2006.01)
H05K 1/02 (2006.01)
H05K 7/20 (2006.01)
H01L 35/28 (2006.01)

(52) U.S. Cl.
CPC ............ *G06F 1/203* (2013.01); *G06F 1/1626* (2013.01); *H05K 1/0203* (2013.01); *H05K 7/20172* (2013.01); *H05K 7/20336* (2013.01); *H05K 7/20436* (2013.01); *G06F 1/1637* (2013.01); *G06F 2200/201* (2013.01); *H01L 35/28* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,292,441 B2 * | 11/2007 | Smalc | ................... | G06F 1/203 361/704 |
| 7,480,141 B2 * | 1/2009 | Takenoshita | ............ | G06F 1/203 349/161 |
| 8,339,787 B2 * | 12/2012 | Tsai | ........................ | G06F 1/206 165/104.33 |
| 8,587,945 B1 * | 11/2013 | Hartmann | .......... | H05K 7/20454 361/679.53 |
| 9,095,077 B2 * | 7/2015 | Bhardwaj | .......... | H05K 7/20481 |
| 9,836,099 B2 * | 12/2017 | Huang | .................... | G06F 1/203 |
| 9,930,785 B2 * | 3/2018 | Huang | .................. | H05K 1/189 |
| 2015/0029661 A1 * | 1/2015 | Huang | .................... | G06F 1/203 361/679.54 |
| 2015/0070836 A1 * | 3/2015 | Yairi | ........................ | G06F 1/20 361/679.47 |

(Continued)

*Primary Examiner* — Lisa Lea Edmonds
(74) *Attorney, Agent, or Firm* — Guice Patents PLLC (57) ABSTRACT

A foldable electronic device includes a upper housing, a lower housing, and at least one energy module which further included thermoelectric materials which may convert heat to electric power. The energy module may supply power to at least one of heat generating component in the portable electronic device. A heat remover composed of graphene may be in thermal contact with the at least one of the components. The heat remover may also disposed over a surface of the energy module and may be formed one or more heat conduction path depends on the position of the upper and lower housings.

8 Claims, 5 Drawing Sheets

(56) References Cited

U.S. PATENT DOCUMENTS

2015/0169015 A1\* 6/2015 Yebka .................... G06F 1/203
  361/679.54
2015/0382446 A1\* 12/2015 Kwon .................... H05K 1/028
  174/251

\* cited by examiner

DYNAMIC HEAT CONDUCTING PATH FOR PORTABLE ELECTRONIC DEVICE

BACKGROUND

Technical Field

The present disclosure relates to heat dissipation in electronic devices. More specifically, the present embodiments related to an electronic device having a configurable, flexible and ultra-thin heat remover for portable electronic devices depended the positions of the devices.

Related Art

Electronic devices may include housing, window cover secured to the housing, and a set of packed components which are packed within a small size of housing. Powerful computer components allow the design and construction of higher performance portable computing devices. However, the use of such powerful computer components often results in increased heat generation by these computing devices. Therefore, improved heat dissipation technology or structure is often needed to maintain operating temperatures of the electronic devices within proper range.

The heat-dissipation mechanisms for electronic devices generally involve the use of extra materials and/or parts. For instance, heat spreader, cooling fans, vents, heat pipes may be employed to remove heat from components in an electronic device.

Hence, compact designs for portable electronic devices may be designed by ultra-thin components and/or materials to avoid hot spots near certain components such as a processor, display, and/or storage.

SUMMARY OF THE INVENTION

Many aspects of the embodiments related to techniques for spreading of heat throughout a computer system or efficiently expelling heat, depended on positions of the device, to avoid overheat near certain components such as display, CPU, GPU, and other temperature sensitive components inside a compact electronic device. The portable electronic device comprises a battery pack, at least one of a processor, power manage unit (PMU), at least one display module, at least one printed circuit board (PCB), at least one flexible printed circuit board (FPCB), at least one solid state disk (SSD), at least one hard disk drive (HDD), at least one radio transceiver, and other components.

BRIEF DESCRIPTION OF THE FIGURES

The present invention is illustrated by way of example and not limitation in the figures of the accompanying drawing. The components in the drawings are not necessarily drawn to scale.

DETAILED DESCRIPTION

Graphene is pure carbon in the form of a very thin, nearly transparent sheet, one atom thick. It is remarkably strong for its very low weight (100 times stronger than steel) and it conducts heat and electricity with great efficiency.

Graphite is composed of layers of carbon atoms that are arranged in 6-membered, hexagonal rings. These rings are attached to one another on their edges. Layers of fused rings can be modeled as an infinite series of fused benzene rings (without the hydrogen atoms).

The following table shows the comparison of thickness for different materials.

|  | Graphene | Grapheme thermal film | Graphite |
|---|---|---|---|
| Thickness (um) | 1-100 nm | >10 | 25-200 |

A graphene layer disclosed in the embodiments is ranged in 1-5 nm, 1-20 nm, 20-30 nm, 5-100 nm, and/or less than 1 mm.

The disclosure is illustrated by way of example and not by way of limitation in figures of the drawings. It should be noted that references to "an" or "one" embodiment in this disclosure are not necessarily to the same embodiment, and such references mean at least one.

Figure 1:
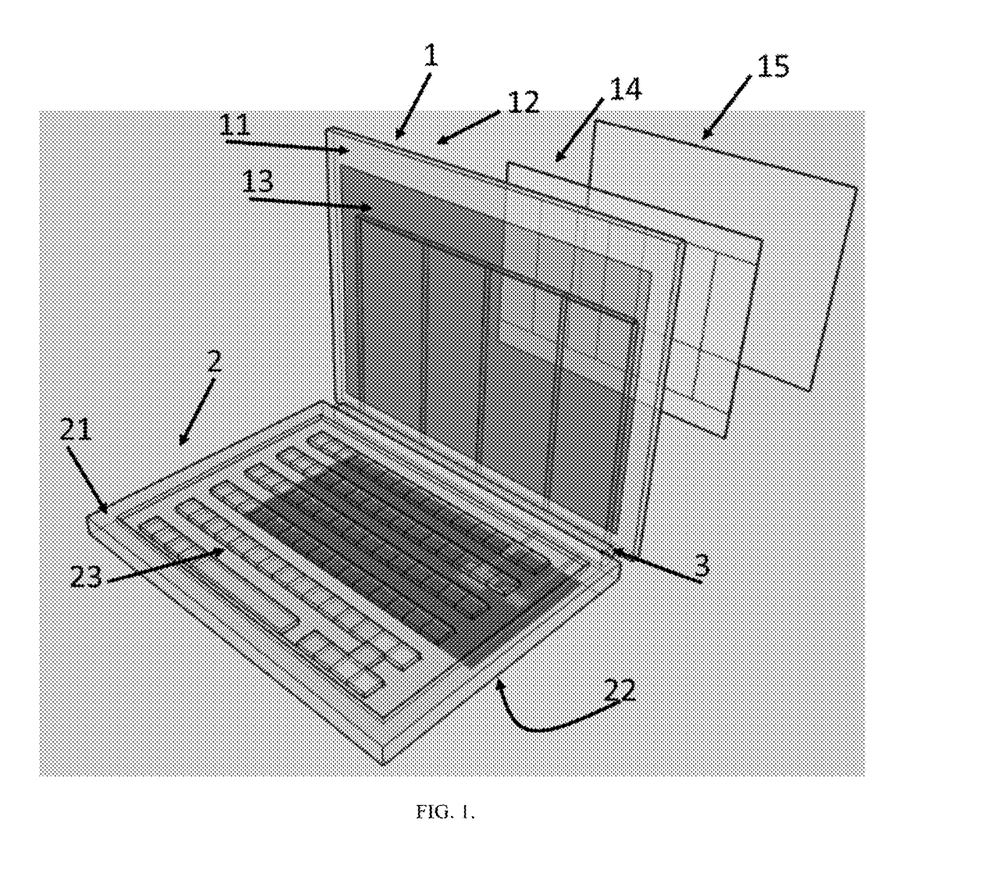
FIG. 1 shows a partial perspective view of an electronic device having a plurality of components in accordance with an embodiment.

FIG. 1 shows the overview of the arrangement of components within a portable electronic device. The portable electronic device may correspond to a wrist-worn device, tablet, laptop, personal digital assistant (PDA), medial player, mobile phone, digital camera/camcorder, and/or any battery-powered electronic device. Referring to FIG. 1, the portable electronic device may comprises a upper housing 1, a lower housing 2, a connecting portion 3 connected the upper housing 1 and the lower housing 2. The connecting portion 3 further allows the upper housing 1 and the lower housing 2 to rotate or pivot to each other.

Referring to FIG. 1, the upper housing 1 of the portable electronic device comprises a front wall 11, a rear wall 12 and a display 13, showing image, assembled with the front wall 11. There is an optional second display (not shown) assembled with the rear wall 12 to display image while the upper housing 1 is folded with the lower housing 2 with the display 13 on the front wall 11 is covered. All the displays may comprising a touch screen on a top surface of the structure.

The exterior surface of the upper housing 1 of the portable electronic device comprises heat conduct materials such as metal, graphene/graphite, plastic, and/or the combination of some of these materials. The metal materials may comprising cropper, aluminum, gold and/or other thermal conduction materials.

Referring to FIG. 1, the lower housing 2 of the portable electronic device comprises an upper wall, a bottom wall 22 and an input interface 23 on the top wall 21 and assembled with the top wall 21. There is an optional second display (not shown) assembled with the bottom wall 22 to display image while the upper housing 1 is folded with the lower housing 2 with the input interface 23 on the top wall 21 is covered. In addition, the input interface 23 on the top wall 21 can be a mechanical input keyboard or a display module with touch screen which allows for typing the data through the display module. All the displays may comprising a touch screen on a top surface of the structure.

Further, all the display modules on both sides of the upper housing 1 or both sides of the lower housing 2, as disclosed in this invention, can be implemented as touch screen which allows for typing the data through the display module.

The exterior surface of the lower housing 2 of the portable electronic device comprises heat conduct materials such as metal, graphene/graphite, plastic, and/or the combination of some of these materials. The metal materials may comprising cropper, aluminum, gold and/or other thermal conduction materials.

Figure 2:
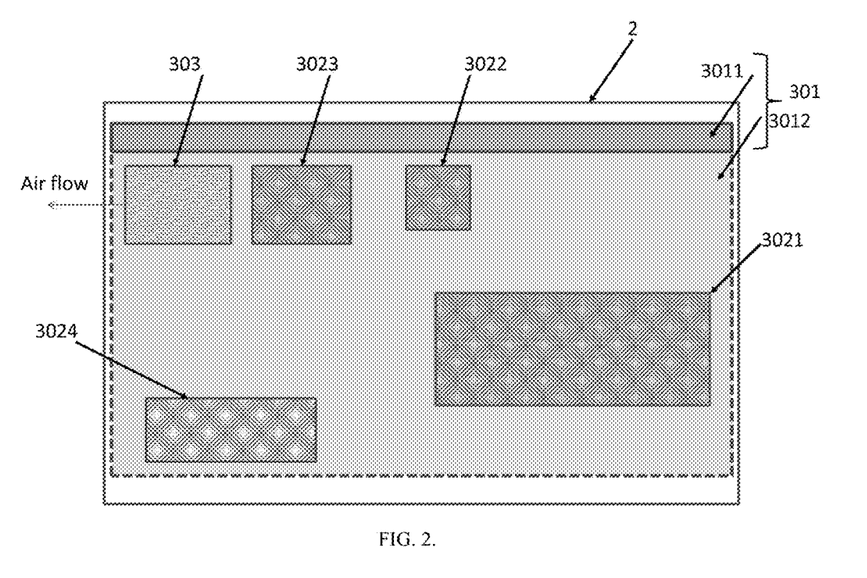
FIG. 2 shows top view, with partial-transparency, of the structure inside the lower housing of the portable electronic device in accordance with the disclosed embodiment.
Figure 3:
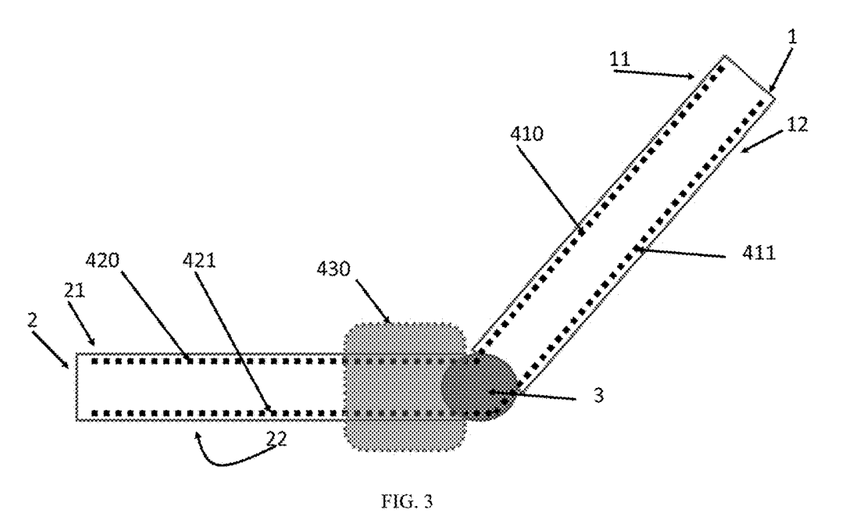
FIG. 3 and FIG. 4 show a cross-sectional view of a portable electronic device in accordance with the disclosed embodiment.

FIG. 2 shows top view, with partial-transparency, of the structure inside the lower housing 2 of the portable electronic device in accordance with the disclosed embodiments. The components/parts inside the lower housing 2 comprise at least one heat generating component located on at least one circuit board. The circuit board can be printed circuit board (PCB), flexible printed circuit board (FPCB) or combination thereof. At least one heat remover 301 structured to contact with the at least one heat generating component to conduct the heat away from the at least one heat generating component.

The at least one heat generating component may be semiconductor chip, radio frequency (RF) chip, data storage 3021, and/or other electronic components.

At least one optional airflow generator 303 arranged to contact with the at least one heat remover 301 and, therefore, conduct the heat, by using the at least one heat remover 301, from the at least one heat generating component and remove it through the airflow.

The at least one heat remover further comprises a main flexible portion 3012 and a main reinforce portion 3011. The main flexible portion 3012 comprises graphene and/or graphite, wherein the main flexible portion 3012 is arranged to thermal contact with the at least one heat generating component. Wherein, the main reinforce portion 3011 is arranged to further contact with the other heat remover 301.

At least one, optional, energy module 3024 may supply power to circuit board, display module, and/or other components of portable electronic device. In addition, the energy modules may comprises thermoelectric materials as a sub-module, which converts heat to electrical energy (and the reverse) with no moving parts. The at least one energy modules can provide electronic energy transfer from/to each other depends on the location of the thermoelectric submodule The operation of portable electronic device may generate heat with usage of the heat generating components as discussed in above paragraphs. This may results in an increase in the temperature(s) of the components. For instance, the user operations on the portable electronic device may cause the central processing unit (CPU) and associated chips of the device to heat up. Therefore, the local temperature(s) buildup may cause injury to a user. In addition, the electronic components/parts may lose reliability, and/or fail prematurely.

Therefore, the portable electronic device may include structures for removing heat from the components inside the portable electronic device.

Because heat-dissipation materials may take up space within the portable electronic device and may also increase the material and assembly costs for portable electronic device. A heat remover/spreader may be flexible and comprising at least one layer of graphite may be positioned over the surface of the first energy module or the second energy module, or both of the first energy module and the second energy module. A heat remover/spreader comprising at least one layer of graphite may be positioned in thermal contact with circuit board and/or at least one heat generating component inside the portable electronic device to allow heat generated by the at least one heat generating component to spread to the at least one energy module 3024, the airflow generator 303, the enclosure of the portable electronic device, and/or a top layer of the display module. The thickness of the at least one layer of the graphite/graphene/thermal film is as discussed in previous paragraph.

Figure 4:
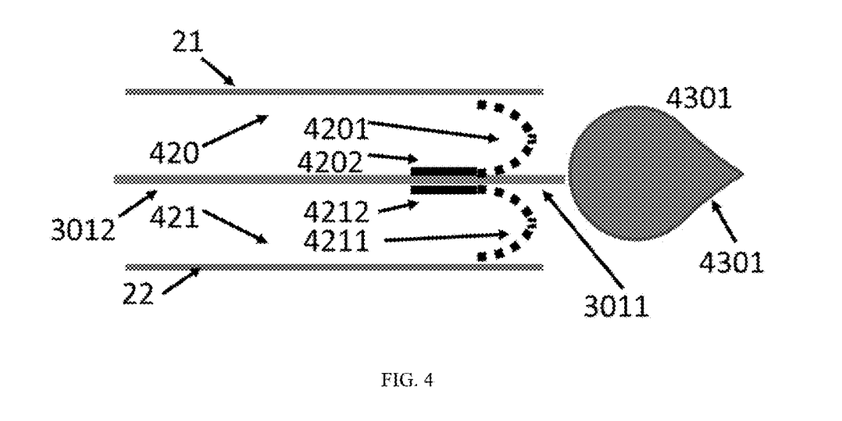

FIG. 4 shows a cross-sectional view of a portable electronic device in accordance with the disclosed embodiments. As shown in FIG. 4, the portable electronic device includes a front wall heat remover 410, a rear wall heat remover 411, a top wall heat remover 420, and a bottom wall heat remover 421. Each of the front wall heat remover 410, the rear wall heat remover 411, the top wall heat remover 420, and the bottom wall heat remover 421 may further extends to a side wall portion between the front wall and rear wall, or a side wall portion between the top wall and the bottom wall. The disclosed front wall heat remover 410, the rear wall heat remover 411, the top wall heat remover 420, and the bottom wall heat remover 421 maybe a layer of heat conduct material(s) comprises graphene and attaches to the enclosure of the portable electronic device included top wall, rear wall, top wall, bottom wall, and side walls therebetween, wherein the enclosure of the portable electronic device comprises heat conduct material, therefore, removes the heat conducted from the heat removers.

The disclosed front wall heat remover 410, the rear wall heat remover 411, the top wall heat remover 420, and the bottom wall heat remover 421 maybe graphene material combines with the enclosure of the portable electronic device included top wall, rear wall, top wall, bottom wall, and side walls therebetween, wherein the enclosure of the portable electronic device comprises heat conduct material such as graphene, graphite, copper, aluminum, gold, and/or other high heat conduction materials.

FIG. 4 shows the portable electronic device further comprises a heat conduction controller 430. The heat conduction controller 430 selectively conducts/connects the heat generated from the heat generating components to either the front wall heat remover 410, the rear wall heat remover 411, the top wall heat remover 420, the bottom heat remover, or combination thereof. The heat generated by the heat generating components, therefore, is removed from the enclosure of the portable electronic device which thermally connected to the heat removers as discussed above. The disclosed heat remover maybe removes the heat to the enclosure individually. Alternatively, the disclosed heat remover maybe groups the front wall heat remover 410 and the rear wall heat remover 411 as one group (thermally connected). In addition, the disclosed heat remover maybe groups the top wall heat remover 420 and the bottom wall heat remover 421 as one group (thermally connected).

Furthermore, the heat conduction controller 430 selectively conducts/connects the heat generated from the heat generating components to either the group of the front wall heat remover 410 and the rear wall heat remover 411, or the group of the top wall heat remover 420 and the bottom wall heat remover 421 depended on the position of the portable electronic device.

The heat conduction controller 430 conducts/connects the heat generated from the heat generating components to the bottom wall heat remover 421 when upper housing 1 is pivoted/rotated to less than a predetermine angle (for example 45 degree or smaller) between the front wall and the top wall.

The heat conduction controller 430 conducts/connects the heat generated from the heat generating components to the top wall heat remover 420 when upper housing 1 is pivoted/ rotated to less than a predetermine angle (for example 45 degree or smaller) between the rear wall and the bottom wall.

A first heat conduction means thermally connected between the at least one heat generating component, on either side of the circuit board, and the at least one energy module 3024. In addition, the first heat conduction has the direction of the heat conduction from the at least one heat generating component, on either side of the circuit board, to the at least one energy module 3024.

A second heat conduction means thermally connected between the at least one heat generating component, on either side of the circuit board, and the top wall heat remover 420. Furthermore, the top wall heat remover 420 may further thermally connects/conducts to the front wall heat remover 410. In addition, the second heat conduction has the direction of the heat conduction from the at least one heat generating component, on either side of the circuit board, to the top wall heat remover 420. Therefore, the heat is removed from an enclosure of the portable electronic device through the conduction of the heat remover(s) as discussed above.

A third heat conduction means thermally connected between the at least one heat generating component, on either side of the circuit board, and the bottom wall heat remover 421. Furthermore, the bottom wall heat remover 421 may further thermally connects/conducts to the rear wall heat remover 411. In addition, the third heat conduction has the direction of the heat conduction from the at least one heat generating component, on either side of the circuit board, to the bottom wall heat remover 421. Therefore, the heat is removed from an enclosure of the portable electronic device through the conduction of the heat remover(s) as discussed above.

A fourth heat conduction means thermally connected between the at least one heat generating component, on either side of the circuit board, and both the top wall heat remover 420 and the bottom wall heat remover 421. Furthermore, the top wall heat remover 420 may further thermally connects/conducts to the front wall heat remover 410. In addition, the bottom wall heat remover 421 may further thermally connects/conducts to the rear wall heat remover 411.

As a result, the fourth heat conduction has the direction of the heat conduction from the at least one heat generating component, on either side of the circuit board, to both the top wall heat remover 420 and the bottom wall heat remover 421. Furthermore, both the top wall heat remover 420 and the bottom wall heat remover 421 may further connect/conduct to the front wall heat remover 410 and the rear wall heat remover 411 respectively. Therefore, the heat is removed from an enclosure of the portable electronic device through the conduction of the heat remover(s) as discussed above.

A fifth heat conduction means thermally connected between the at least one heat generating component, on either side of the circuit board, and a heat spreader of the at least one airflow generator 303 through the heat remover which thermally contact the at least one heat generating component.

Figure 5:
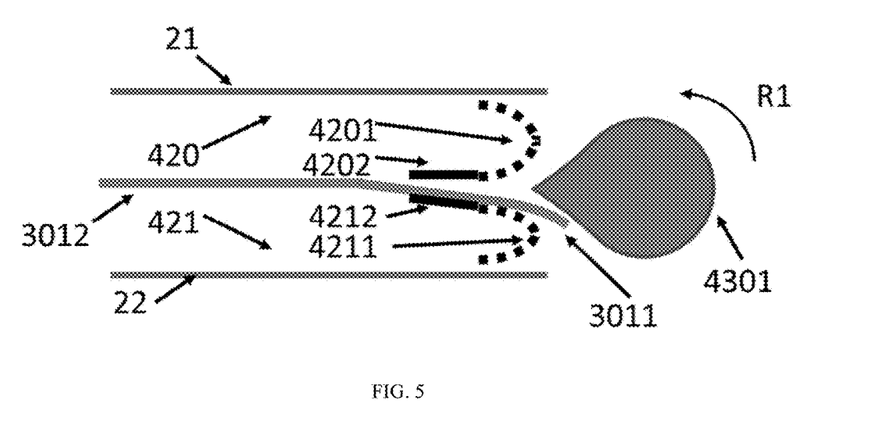
FIG. 5 and FIG. 6 show the detail structure of the heat conduction controller.

FIG. 5 shows the detail structure of the heat conduction controller 430. As discussed above, the function of the heat remover of the heat generating component comprising is to remove the heat generated by the at least one heat generating component located on either side of the circuit board, which could be either PCB or FPCB. In case of having the at least one heat generating component located on both sides of the circuit board, at least one heat remover will be arranged on each side of the circuit and then combined and connected/conducted to a main flexible portion 3012 as shown in FIG. 5. The main flexible portion 3012 further extends to a main reinforce portion 3011 which also comprising the same highly heat conduction material(s) as discussed above. The strength of the main reinforce portion 3011 of the heat remover maybe gradually increase or a support frame (not shown) located on both side of the heat remover. Therefore, the heat remover of the heat generating component is maintain substantially on a plan and thermally contact with an extension of the top wall heat remover 420 and an extension of the bottom wall heat remover 421, as shown in FIG. 5. The top wall heat remover 420 and the bottom wall heat remover 421, as discussed above may further extend and thermally conduct with the front wall heat remover 410 and the rear wall heat remover 411 respectively.

Figure 6:
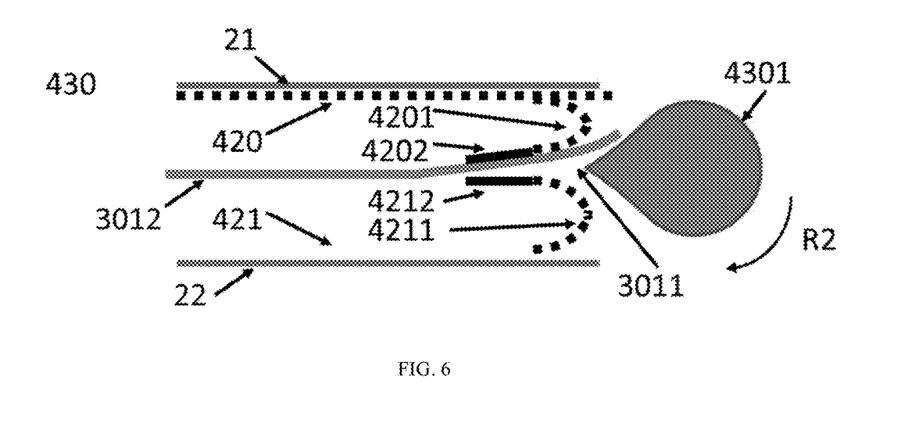

The extension of the top wall heat remover 420 comprises a first flexible portion 420 1and a first reinforce portion 4202. The first flexible portion 4201 is located between the top wall heat remover 420 and the first reinforce portion 4202 as shown in FIG. 5. A fixed size of intermediate flexible portion (not shown) maybe connected between the top wall heat remover 420 and the first reinforce portion 4202 and limited the distance between the top wall heat remover 420 and the first reinforce portion 4202 when the first reinforce portion 4202 is no longer in touch with the other heat remover, as shown in FIG. 5 and FIG. 6.

Similarity, the extension of the bottom wall heat remover 421 comprises a second flexible portion 4211 and a first reinforce portion 4202. The second flexible portion 4211 is located between the bottom wall heat remover 421 and the second reinforce portion 4212 as shown in FIG. 5. A fixed size of intermediate flexible portion (not shown) maybe connected between the bottom wall heat remover 421 and the second reinforce portion 4212 and limited the distance between the bottom wall heat remover 421 and the second reinforce portion 4212 when the second reinforce portion 4212 is no longer in touch with the other heat remover, as shown in FIG. 5 and FIG. 6.

Figure 7:
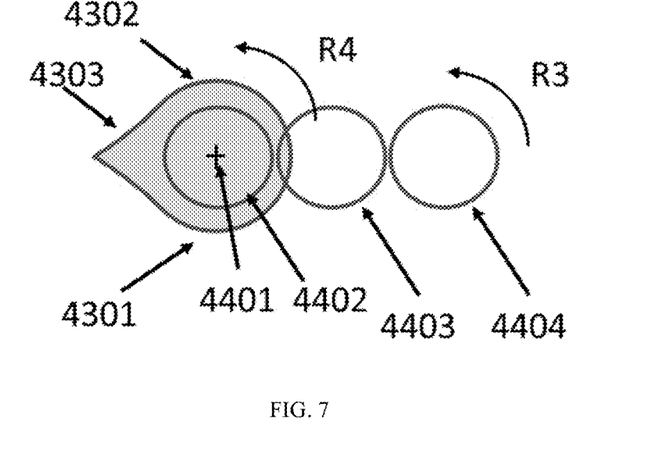
FIG. 7 shows an example design of the gear structure to drive the heat conduction guide.

When the user changes the position between of the upper housing 1 and the lower housing 2, the rotation between the upper housing 1 and the lower housing 2, with respect to an axis, will cause a first gear structure 4404 rotating in a direction, as shown in FIG. 7. As shown in FIG. 7, the first gear will drive a second gear 4403 then a third gear 4402 fixed to the same axis 4401 of the heat conduction guide 4301.

FIG. 7 only shows an example design of the gear structure to drive the heat conduction guide 4301. Accordingly, many modifications and variations, for instance changing number of the gears and reverse the direction of the heat conduction guide 4301, will be apparent to practitioners skilled in the art.

In a first case, when user changes the position between of the upper housing 1 and the lower housing 2, the rotation between the upper housing 1 and the lower housing 2 will eventually cause the heat conduction guide 4301 turn in a first direction R1, as shown in FIG. 5. The heat conduction guide 4301 comprises a circular shape portion 4302 and a protrusion corn shape portion 4303 in a cross-section view, as shown in FIG. 7. In the first case, the protrusion corn shape portion pushes the main reinforce portion 3011 of the heat remover and further pushes the second reinforce portion 4212. Therefore, the first case causes more contact between the main reinforce portion 3011 of the heat remover and the second reinforce portion 4212. On the other hand, since the first reinforce portion 4202, on the other side of the main reinforce portion 3011, is limited to the predetermined distance as discussed above, the main reinforce portion 3011 and the first reinforce portion 4202 is detached/disconnected in the first case.

Therefore, in the first case, the heat conduction connected between the at least one heat generating component, on either side of the circuit board, and the top wall heat remover 420 is disconnected due to the main reinforce portion 3011 and the first reinforce portion 4202 is detached/disconnected. On the other hand, the heat conduction connected between the at least one heat generating component, on either side of the circuit board, and the bottom wall heat remover 421 is remained.

In a second case, when user changes the position between of the upper housing 1 and the lower housing 2, the rotation between the upper housing 1 and the lower housing 2 will eventually cause the heat conduction guide 4301 turn in a second direction R2, as shown in FIG. 6. In the second case, the protrusion corn shape portion pushes the main reinforce portion 3011 of the heat remover and further pushes the first reinforce portion 4202. Therefore, the second case causes more contact between the main reinforce portion 3011 of the heat remover and the first reinforce portion 4202. On the other hand, since the second reinforce portion 4212, on the other side of the main reinforce portion 3011, is limited to the predetermined distance as discussed above, the main reinforce portion 3011 and the second reinforce portion 4212 is detached/disconnected in this case.

Therefore, in the second case, the heat conduction connected between the at least one heat generating component, on either side of the circuit board, and the bottom wall heat remover 421 is disconnected due to the main reinforce portion 3011 and the second reinforce portion 4212 is detached/disconnected. On the other hand, the heat conduction connected between the at least one heat generating component, on either side of the circuit board, and the top wall heat remover 420 is remained.

In a third case, when user changes the position between of the upper housing 1 and the lower housing 2, the rotation between the upper housing 1 and the lower housing 2 cause the heat conduction guide 4301 turn in a position which the main reinforce portion 3011 is no longer pressed by the protrusion corn shape, as shown in FIG. 4. In the third case, the protrusion corn shape portion no longer pushes the main reinforce portion 3011 of the heat remover. Therefore, both the first and second reinforce portion 4212 are thermally connected/conducted to the main reinforce portion 3011.

Therefore, in the third case, the heat conduction connected between the at least one heat generating component, on either side of the circuit board, and the top wall heat remover 420 and the bottom wall heat remover 421 are remained.

As discussed above, the heat remover maybe composed of graphene/graphite and/or other heat conduct materials. The heat remover may be disposed over a surface of any energy module and/or a surface of any heat generating component by attaching a monolayer of graphene and/or combined with other heat conduct materials onto the surface of the surface of any energy module and/or the surface of any heat generating component.

Furthermore, the use of graphene in the heat remover/spreader may reduce the amount of space occupied by the heat remover/spreader very significantly while providing highly effective dissipation of heat from heat generator or heat source. The thermal conductivity of graphene near room temperature may range from $4.8 \pm 0.5 \times 10^3$ to $5.3 \pm 0.5 \times 10^3$ $Wm^{-1} K^{-1}$, which is obvious better than other materials like graphite, copper, carbon nanotube and/or diamond. Therefore, heat remover may remove heat away from any heat generator/source more effectively than any known material, included graphite, copper, carbon nanotube and/or diamond. Using graphene will increase reliability, safety, and performance during use of the portable electronic device.

In addition, the character of high tensile strength of graphene may results in a graphene monolayer less than one nanometer thickness to be used as heat remover/spreader compared to other heat spreader materials which may range in thickness from tens of microns to a millimeter scale. Consequently, as discussed above, the reduction in thickness/space sized by heat remover may results in a decrease in the portable electronic device's size/thickness and an increase in the portable electronic device's portability or design attractiveness. On the other hand, the extra space savings may increase the size of the energy module 3024; add more components to the portable electronic device, therefore, further improve the functionality or operation hours of the portable electronic device.

The process of facilitating the use of heat remover comprising graphene in a portable electronic device in accordance with the disclosed embodiment(s) comprising:

First, the circuit board and/or display module with at least one heat generating component are arranged within an enclosure of the portable electronic device. Then, the at least one energy module is arranged closed to the at least one heat generating component 3022/3023. The at least one heat generating component 3022/3023 may include a CPU, a graphic process unit (GPU), a PSU, a PCB, a RF components, a data storage 3021 such as SSD, HDD, or RAM, a backlight, a LED, a charging circuit, a signal circuit.

The energy module may correspond to a lithium-ion, solid-state or lithium-polymer battery, and/or thermoelectric materials which can convert the heat to electrical energy (and the reverse) with no moving parts.

Second, the heat remover comprising graphene is disposed over a surface of the energy module allowing heat transfer in either way. The graphene may be grown on a substrate and/or exfoliated from graphite. Then, the graphene is pressed onto the surface of the energy module. A adhesive material may be applied between the heat remover and the surface of the energy module.

Third, the heat remover comprising graphene is applied to the at least one of the heat generating component 3022/3023 with thermal contact. Therefore, the heat remover may be extended over the battery onto the surface of a circuit board which is located side-by-side with the battery. With this arrangement step, the heat remover may transfer heat from the components to the energy module and/or other parts/components of the portable electronic device. As a result, the temperature of the energy module may increase and further extend runtime of the energy module which may include solid-state battery as discussed above.

The disclosed heat remover can be used in any type of electronic comprising data processor (CPU, GPU, PSU, PMU), a storage (RAM, SSD, etc.), a display, and energy module which provides power and/or convert heat to power. The portable electronic device may correspond to a wrist-worn device, tablet, laptop, personal digital assistant (PDA), medial player, mobile phone, digital camera/camcorder, and/or any battery-powered electronic device. Energy module may correspond to a battery pack included one or more battery cells along with a thermoelectric materials. The heat remover comprising graphene may be disposed over a contact surface of the energy module (included thermoelectric materials) and in thermal contact with the at least one of the heat generating component 3022/3023 (as discussed above) of the portable electronic device. The heat remover may transfer heat from the at least one components to the energy module and/or other portion of the portable electronic device.

While certain embodiments have been described and shown in the accompanying drawings, it is to be understood, even though information as to, that such embodiments are merely illustrative and not restrictive of the current invention, and this invention is not restricted to the specific constructions and arrangements shown and described since modifications may apply to those ordinarily skilled in the art. Additionally, changes may be made in detail, especially in the matters of size, shape, and arrangement of parts within the present embodiments to the full extend indicated by the broad general meaning of the terms in which the appended claims are expressed.

What is claimed is:

1. A portable electronic device, comprising:
    a lower housing comprising a first wall, a second wall opposite to the first wall, and at least one side wall; and
    an upper housing comprising a front wall, a rear wall opposite to the front wall, and at least one side wall, wherein the upper housing rotatably connects to the lower housing;
    a transparent screen located on the first wall;
    a display module comprising at least one heat generating component, wherein the display module generates image and displays through the transparent screen;
    a circuit board comprising at least one heat generating component on at least one side of the circuit board;
    a first heat remover disposed over a surface of the at least one heat generating component on either one of the display module and the circuit board, wherein the first heat remover comprises graphene; and
    the first wall comprises a first wall heat remover, wherein the first wall heat remover and the first heat remover are arranged as two configurations: in a first configuration, the first wall heat remover thermally connects to the first heat remover; in a second configuration, the first wall heat remover disconnects to the first heat remover; and
    the second wall comprises a second wall heat remover, wherein the second wall heat remover and the first heat remover are arranged as two configurations: in a first configuration, the second wall heat remover thermally connects to the first heat remover; in a second configuration, the second wall heat remover disconnects to the first heat remover; and
    wherein when an angle between the first wall and the front wall is less than a predetermined angle, the configuration of the first wall heat remover and the first heat remover are in the second configuration and the configuration of the second wall heat remover and the first heat remover are in the first configuration; and
    wherein when an angle between the second wall and the rear wall is less than the predetermined angle, the configuration of the first wall heat remover and the first heat remover are in the first configuration and the configuration of the second wall heat remover and the first heat remover are in the second configuration.

2. The portable electronic device of claim 1, wherein the first heat remover further comprises a main flexible portion thermally contacts the at least one heat generating component located on the circuit board.

3. The portable electronic device of claim 2, wherein the main flexible portion further thermally contacts the at least one heat generating component located on the display module.

4. The portable electronic device of claim 3, wherein the main flexible portion further extends to a gap between a thermal surface of an airflow generator and another adjacent portion of the portable electronic device and thermally contacts to the thermal surface of the airflow generator, wherein the gap is less than 200 nm.

5. The portable electronic device of claim 4, wherein the first heat remover further comprises a main reinforce portion selectively and thermally contacts the first wall heat remover and the second wall heat remover depended on the predetermine angle between the first wall and the front wall.

6. The portable electronic device of claim 5, wherein when an angle between the first wall and the front wall is more than a predetermined angle, the configuration of the first wall heat remover and the first heat remover are in the first configuration and the configuration of the second wall heat remover and the first heat remover are in the first configuration.

7. The portable electronic device of claim 6, wherein when an angle between the second wall and the rear wall is more than a predetermined angle, the configuration of the first wall heat remover and the first heat remover are in the first configuration and the configuration of the second wall heat remover and the first heat remover are in the first configuration.

8. A portable electronic device, comprising:
    a lower housing comprising a first wall, a second wall opposite to the first wall, and at least one side wall; and
    an upper housing comprising a front wall, a rear wall opposite to the front wall, and at least one side wall, wherein the upper housing rotatably connects to the lower housing;
    a transparent screen located on the front wall;
    a display module comprising at least one heat generating component, wherein the display module generates image and displays through the transparent screen;
    a circuit board comprising at least one heat generating component on at least one side of the circuit board;
    a first heat remover disposed over a surface of the at least one heat generating component on the circuit board, wherein the first heat remover comprises graphene; and
    the first wall comprises a first wall heat remover, wherein the first wall heat remover and the first heat remover are arranged as two configurations: in a first configuration, the first wall heat remover thermally connects to the first heat remover; in a second configuration, the first wall heat remover disconnects to the first heat remover; and
    the second wall comprises a second wall heat remover, wherein the second wall heat remover and the first heat remover are arranged as two configurations: in a first configuration, the second wall heat remover thermally connects to the first heat remover; in a second configuration, the second wall heat remover disconnects to the first heat remover; and
    wherein when an angle between the first wall and the front wall is less than a predetermined angle, the configuration of the first wall heat remover and the first heat remover are in the second configuration; and wherein when an angle between the second wall and the rear wall is more than a predetermined angle, the configuration of the first wall heat remover and the first heat remover are in the first configuration and the configuration of the second wall heat remover and the first heat remover are in the first configuration.

\* \* \* \* \*